United States Patent [19]

Feucht

[11] 4,140,927
[45] Feb. 20, 1979

[54] NON-OVERLAPPING CLOCK GENERATOR
[75] Inventor: Charles A. Feucht, Elgin, Ill.
[73] Assignee: Teletype Corporation, Skokie, Ill.
[21] Appl. No.: 784,094
[22] Filed: Apr. 4, 1977
[51] Int. Cl.² ............... H03K 5/15; H03K 5/153; H03B 27/00; H03K 3/353
[52] U.S. Cl. .................... 307/262; 307/205; 307/208; 307/265; 328/62; 331/45
[58] Field of Search ......... 307/208, 221 C, 262, 307/265, 268, 269; 328/62; 331/45, 60

[56] References Cited

U.S. PATENT DOCUMENTS

| | | | |
|---|---|---|---|
| 3,641,370 | 2/1972 | Heimbigner | 307/269 |
| 3,740,660 | 6/1973 | Davies, Jr. | 307/262 X |
| 3,927,334 | 12/1975 | Callahan | 307/269 |
| 3,946,255 | 3/1976 | Stein | 307/269 |
| 3,950,654 | 4/1976 | Broedner et al. | 307/208 |
| 3,961,269 | 6/1976 | Alvarez, Jr. | 307/262 X |
| 3,986,046 | 10/1976 | Wunner | 307/208 |
| 4,034,242 | 7/1977 | Heeren | 207/208 X |
| 4,045,685 | 8/1977 | Gehrig | 307/269 X |

OTHER PUBLICATIONS

Hatchett, "Nonoverlapping Clocks for Master-Slave Latch"; IBM Tech. Discl. Bull., vol. 19, No. 5, pp. 1695-1696, 10/1976.

*Primary Examiner*—Larry N. Anagnos
*Attorney, Agent, or Firm*—J. C. Albrecht

[57] ABSTRACT

A two-phase, non-overlapping clock signal is generated in response to a single-phase input clock signal by delaying the input clock signal to produce the first phase output clock signal ($\phi_1$), producing a delayed signal from the first phase clock signal, and gating the further delayed first phase clock signal with the input clock signal to produce an inverted signal for a second phase clock signal ($\phi_2$), in order to produce gaps between the trailing edge of one phase of the output clock and the leading edge of the other phase of the output clock signal in order to accommodate dynamic transient conditions that must occur in a following utilization circuit between successive phase clock pulse signals.

10 Claims, 3 Drawing Figures

4,140,927

NON-OVERLAPPING CLOCK GENERATOR

FIELD OF THE INVENTION

The present invention relates to circuits for generating a clock signal and more particularly to a circuit for generating non-overlapping clock signals of two phases in response to a single phase input signal.

BACKGROUND OF THE INVENTION

It is well-known that a two-phase clock signal can be produced from a single phase clock signal simply by duplicating the input clock signal to produce the first phase and then generating an inversion of that first phase to produce a second phase. It is also well-known that the input clock signal can be used to control a squaring amplifier or a feed-back circuit with a flip-flop or Schmidt trigger to produce the two-phase output signals from the normal and inverted outputs of the Schmidt trigger or flip-flop.

It is also known that non-overlapping two phase clocks can be produced by using a "sloppy" flip-flop with considerable internal capacitance such that there are long turn-ON and turn-OFF transients of the transistors at each change of state of the flip-flop producing a substantial period during which the output of the flip-flop is in an indeterminate binary state. In this way, one clock pulse does not become "true" until some period of time after the other phase clock pulse has ceased to be "true".

In many electronic circuits and particularly those such as MOS circuits involving considerable intrinsic capacitance, some period of time is required after the termination or trailing edge of one phase clock signal ($\phi_1$) for signal transients to dissipate before the start or leading edge of the succeeding phase clock signal ($\phi_2$) can be tolerated. Therefore, in the field of MOS integrated circuits there is a great need for non-overlapping clocks. By this term it is particularly meant clocks in which there is a time gap between the trailing edge of one phase of the clock and the leading edge of the next.

In addition, with the advent of large scale integration of MOS circuitry, integrated circuit chips have become terminal limiting in that the complexity of the circuit on a single wafer or chip of silicon is limited by the number of external leads that can be connected to the circuit chip. In a circuit using up to three or four different phases of clock signals, the mere existence of all these clock phases uses three or four of the limited terminations of the circuit. Consequently, it is exceedingly desirable to minimize the number of clock terminations at the interface of an MOS circuit. It would be more desirable if a minimum and preferably only one clock signal were communicated to a chip and the appropriate multi-phase generation could be produced on the chip itself.

Since the production of non-overlapping clocks from a single clock source involves some manipulation of timing, some timing control must be built into the circuit on the chip.

SUMMARY OF THE INVENTION

A pair of non-overlapping clocks are generated from a single clock source using a short-duration delay to produce the first clock phase from the input clock signal. The second phase clock signal is produced by gating a delayed version of the first phase clock signal with the input clock signal to produce an inversion for a second phase clock signal having a clock pulse that begins a short interval after the end of the first phase clock signal and ends at the beginning of the input clock signal which is a short duration prior to the beginning of the first phase clock signal.

BRIEF DESCRIPTION OF THE DRAWINGS

The present invention will be more clearly understood with reference to the following detailed description when considered in conjunction with the accompanying drawings wherein.

DETAILED DESCRIPTION

Figure 1:
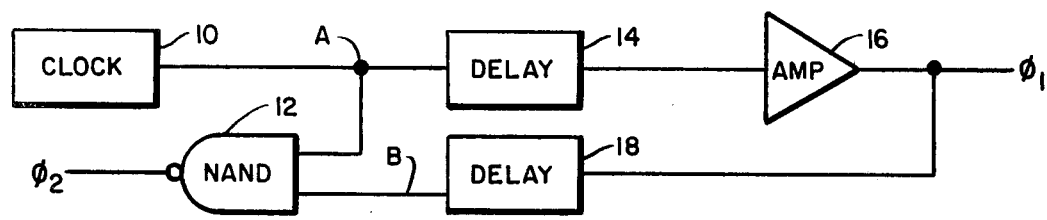
FIG. 1 is a logic diagram of the present clock system.

Referring now to the accompanying drawings and more particularly to FIG. 1, there is shown a logic block diagram for producing two non-overlapping clock signals on an integrated-circuit chip or die. A clock 10 is located off the chip and generates a negative-pulse clock waveform A shown in FIG. 2. This input clock waveform signal is applied to the chip at a location marked A in FIG. 1. The output of the clock 10 is applied to one input of a NAND-gate 12 and also for a first delay 14. The output of the first delay 14 comprises the first phase clock signal and is designated $\phi_1$, shown as the negative pulses of the waveform $\phi_1$ in FIG. 2. The delay 14 may cause some stretching or sloping of the pulse transitions of the clock $\phi_1$. However, an amplifier 16 or a squaring amplifier can be used to minimize any transition times of the clock $\phi_1$.

The clock $\phi_1$ is also used as the input to a second delay 18 to generate an intermediate signal at a point marked B in FIG. 1. This intermediate signal is illustrated as the waveform B in FIG. 2. The intermediate signal B is merely the clock $\phi_1$, but delayed. The second delay 18 may also alter the transition times of the waveform B.

The output of the delay 18 is applied as the other input of the NAND-gate 12. The NAND-gate 12 generates a negative output signal whenever both of its inputs are positive and a positive output signal whenever either of its inputs is negative. The output of the NAND-gate 12 is the second phase clock signal $\phi_2$ which comprises the negative pulses of the waveform $\phi_2$ of FIG. 2.

Figure 2:
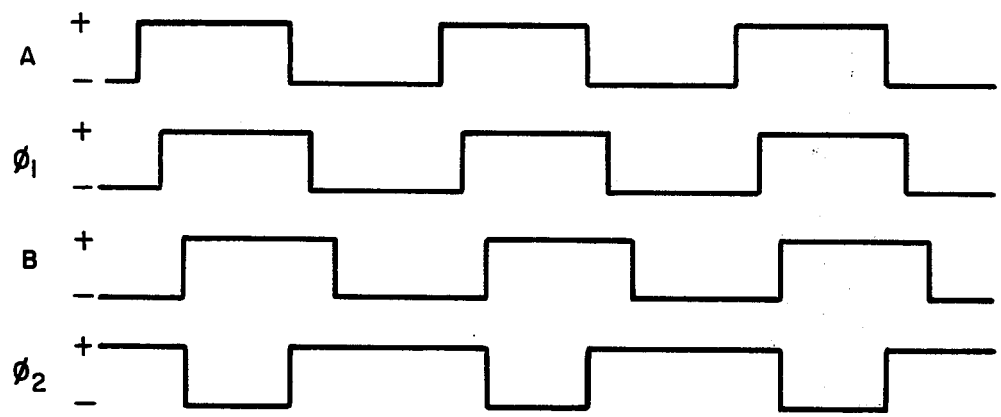
FIG. 2 is a series of waveforms illustrating the signals present at various points in the circuit of FIG. 1.

It can be observed from FIG. 2 that the waveform B turns ON the clock pulse $\phi_2$ and the waveform A, the input from the clock 10, turns it OFF. The clock pulses are not overlapping; because, the first delay 14 assures that the clock pulse $\phi_1$ does not begin until the delay interval, of the first delay 14, after clock pulse $\phi_2$ ends. Similarly, the second delay 18 assures that the clock pulse $\phi_2$ does not begin until a short time, the interval of the delay 18, after the clock pulse $\phi_1$ ends. The NAND-gate 12 may advantageously comprise an amplifier to reduce any stretching of the transitions of the output of the NAND-gate 12.

It will be noted that if the waveform A has a 50% duty cycle (half the time a positive or ground signal and half the time a negative signal), the $\phi_1$ clock signal also has essentially a 50% duty cycle. The negative $\phi_2$ clock phase pulses are then shorter than the negative $\phi_1$ clock phase pulses; by an amount essentially equal to the sum of the delay intervals of the delays 14 and 18. However, if it is desired that the duration of the $\phi_1$ clock pulse be equal to the duration of the $\phi_2$ clock pulse, the duty cycle of the input clock 10 can be adjusted accordingly.

The present invention is preferably implemented in a metal-oxide-semiconductor (MOS) integrated circuit in which field-effect transistors (FETs) are formed on the surface of a chip of silicon. Field-effect transistors are essentially bidirectional devices, that is, current can flow between the controlled terminals of a FET in either direction, assuming in each direction a suitable voltage is applied to the control or gate electrode of the FET.

A field-effect transistor has a substantial dielectric insulation between its gate electrode and the conductive path between its controlled electrodes. Also, there is substantial capacitive coupling inherently existing between the various electrodes of a FET and between these electrodes and the substrate of the chip, which is usually grounded. Of particular significance in a FET circuit is the fact that a substantial amount of this inherent or intrinsic capacitance exists between the gate electrode of a FET and the grounded substrate, as well as the other intrinsic capacitances among the other electrodes of the FET.

Also, compared with the bipolar (PNP and NPN) transistors, considerable ohmic resistance exists between the controlled electrodes of the FET while the FET is ON or conductive. Also, when a FET is OFF or nonconductive, there is an exceedingly small leakage current possible between the controlled electrodes of the FET.

Figure 3:
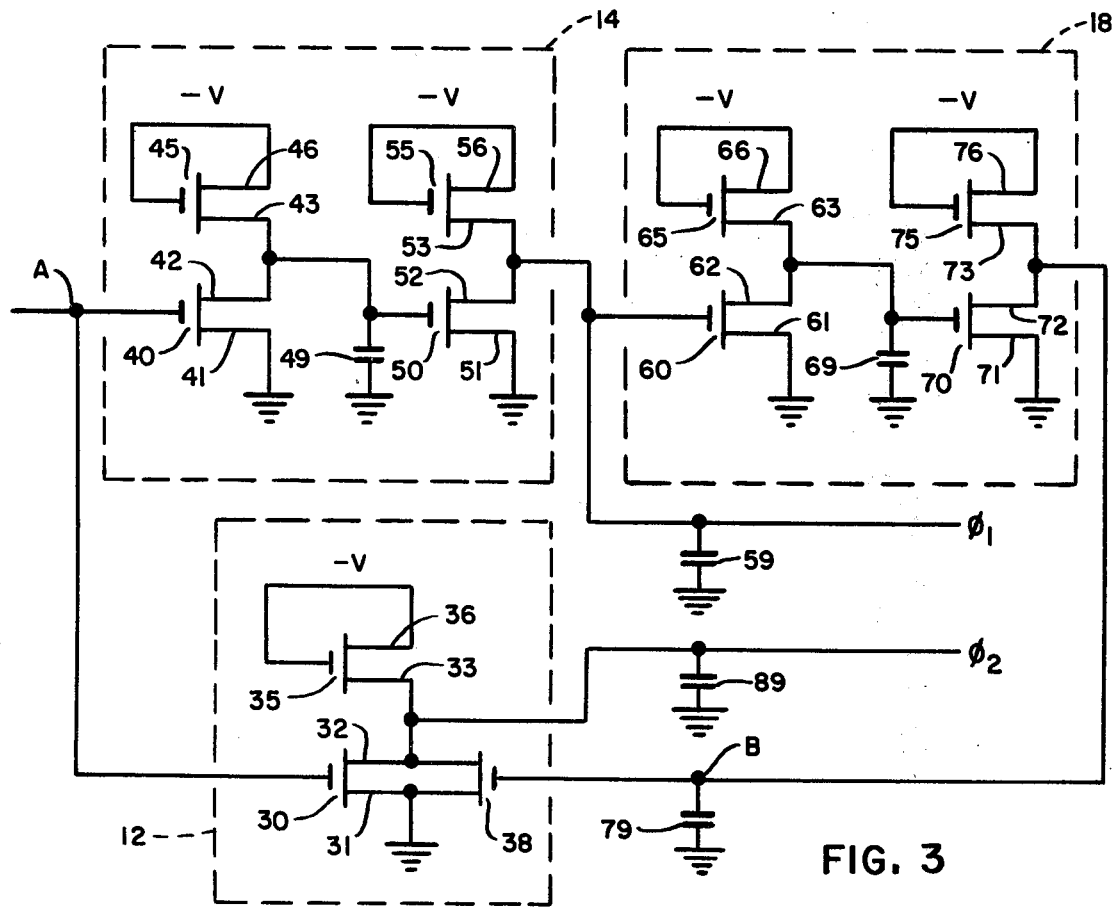
FIG. 3 is a schematic diagram of a preferred implementation of the present invention in MOS-circuit form.

Referring specifically to FIG. 3, the input clock A of FIG. 1 is applied to the chip in FIG. 3 at point A, corresponding to point A in FIG. 1. The input clock signal A is connected to the gate or control electrode of a FET 30. The FET circuit shown in FIG. 3 within the dotted lines marked 12 functions as the NAND-gate 12 of FIG. 1. One controlled or source electrode 31 of the FET 30 is connected to a ground potential. The other controlled or drain electrode 32 of the FET 30 is connected to a controlled or source electrode 33 of a load FET 35. The second controlled or drain electrode 36 and the control or gate electrode of the load FET 35 are both connected to a voltage designated $-V$. Assuming that field-effect transistors known as "P-channel" devices are used, the interconnection of gate and the more negative or drain electrode of the load FET 35 causes the load FET 35 to be in an ON condition at all times or whenever a voltage difference greater than the threshold voltage exists between the source and drain electrodes of the FET. Therefore, the load FET 35 comprises essentially a load resistance between $-V$ and the controlled or drain electrode 32 of the FET 30. Consequently, when a negative voltage is applied at the terminal A of FIG. 3, and thus to the gate electrode of the gate 30, the FET 30 is conductive or ON and draws current through the load FET 35 in order to apply substantially ground voltage to a terminal connection labeled $\phi_2$ in FIG. 3. Any time that the input clock signal A comprises a more positive voltage applied at the terminal A and at the gate electrode of FET 30, the FET 30 is in the OFF condition and the conductance of the load FET 35 can cause the $\phi_2$ bus to be at substantially a $-V$ voltage less the threshold voltage through the ON resistance of the load FET 35.

The gate electrode of the load FET 35 is shown connected to the same voltage source as the more negative controlled or drain electrode 36 of the FET 35. If greater conductivity of the load FET 35 is required, the gate electrode can be connected to a voltage source more negative than $-V$, thereby further increasing the conductivity of the load FET 35. If, however, a higher resistance or lesser conductivity is required of the load FET 35, its gate electrode can be connected to a voltage source slightly more positive than the voltage $-V$.

In the circuit shown in FIG. 3, the $\phi_2$ clock bus will be at substantially ground voltage whenever the input clock is a substantially negative voltage as applied to the gate of the FET 30. When a more positive voltage is applied at the terminal A and thus to the gate of the FET 30, the voltage condition of the $100_2$ clock bus is controlled by another FET 38 of the NAND-gate circuit contained within the dotted lines 12 of FIG. 3. It will be noted that the controlled electrodes 31 and 32 of the FET 30 are connected directly to the controlled electrodes of the FET 38 such that these two FETS are essentially connected in parallel.

The input clock at the terminal A is also connected to the gate electrode of a FET 40 contained within a dotted line 14 which represents the outline of the circuit element corresponding approximately to the first delay element 14 of FIG. 1. A controlled or source electrode 41 of the FET 40 is connected to ground potential. The other controlled or drain electrode 42 of the FET 40 is connected to a controlled electrode 43 which comprises the source electrode of a load FET 45. The gate of the FET 45 and its drain electrode 46 are both shown connected to the source of voltage $-V$. Therefore, the FET 45 functions as a load resistance for the FET 40. Whenever a negative voltage is applied at the terminal A to the gate of the FET 40, the FET 40 is in its conductive or ON condition and draws current through the FET 45 to provide a path to ground potential for discharging a load capacitance 49 to ground potential. Whenever a more positive voltage is applied to the terminal A and the gate of the FET 40, the FET 40 is OFF and the load capacitance 49 is charged through the FET 45 to substantially the supply voltage $-V$ less the threshold voltage of the FET 45. Therefore, whenever the input clock voltage changes from a positive voltage to a negative voltage, the FET 40 turns ON and discharges the capacitor 49 to ground at a rate determined by the capacitance of the capacitor 49 and the ON resistance of the FET 40. Similarly, when the input clock signal at terminal A and the gate of the FET 40 goes from a negative voltage to a positive voltage, the FET 40 turns OFF and the load capacitance 49 is negatively charged at a rate determined by the value of the load capacitance 49 and the resistance of the load FET 45 which is typically in its ON condition. It will be noted that whenever the FET 40 is ON it must not only discharge the capacitance 49 but it must also draw current from the load FET 45.

The load capacitance 49 is, in reality, the intrinsic gate-to-ground capacitance among other capacitances surrounding the gate electrode of a FET 50 also located within the delay circuit 14. The FET 50 also comprises a controlled or source electrode 51 and a drain 52. The drain 52 is connected not only to a bus marked $\phi_1$ but also to a source electrode 53 of a load FET 55. The drain electrode 56 of the load FET 55 together with the gate electrode of the load FET 55 are connected to a voltage $-V$ such that the load FET 55 is essentially in the ON condition.

When the capacitance 49 is charged to a substantial negative voltage, the FET 50 is in the ON condition and resistively connects the $\phi_1$ clock bus to ground potential. A load capacitance 59 connected to the $\phi_1$ clock bus is also discharged to ground potential whenever the FET 50 is in its ON condition. Whenever the load capacitance 49 is substantially discharged to ground voltage, the FET 50 is in its OFF condition and is substantially nonconductive. At this point, the load FET 55 resistively charges the load capacitance 59 and the $\phi_1$ clock bus to substantially the voltage of the voltage source $-V$ less the threshold voltage of the load FET 55.

Consequently, when the terminal A changes from plus or ground potential to a substantial negative voltage, the FET 40 turns ON and discharges the load capacitor 49 to substantially ground potential through the resistance of the ON FET 40. However, this discharge takes some finite length of time. Towards the end of this discharge interval, the FET 50 turns OFF as the voltage across the load capacitance 49 approaches ground potential, and the voltage of the $\phi_1$ clock bus is rapidly charged up toward the voltage $-V$. Therefore, when the terminal A experiences a voltage change from positive or ground voltage to a negative voltage, the $\phi_1$ clock bus also experiences a voltage change from substantially ground voltage to a substantial negative voltage but some time later. That time period is dependent upon at least the capacitance 49 and the ON resistance of the FET 40.

When the voltage at the terminal A changes from a substantial negative voltage to essentially ground voltage or positive voltage, the FET 40 turns OFF and the load capacitance 49 is charged negatively through the ON resistance of the load FET 45. However, the capacitance 49 also cannot be charged instantaneously, and the duration of this charging operation is determined by at least the magnitude of the load capacitance 49 and the ON resistance of the FET 45. When the gate electrode of the FET 50 reaches a substantial negative voltage, the FET 50 turns ON, thereby tending to ground the $\phi_1$ clock bus. Grounding the $\phi_1$ clock bus discharges the load capacitance 59 through the ON resistance of the FET 50 to positive or ground potential. However, the transition of the $\phi_1$ clock bus from negative voltage to a positive or ground voltage takes place some time after the transition of the terminal A from a negative to a positive or ground voltage. This time interval is principally dependent upon the capacitance 49 and the ON resistance of the FET 45 and upon the capacitance 59 and the ON resistance of the FET 50. In this way, the circuit outlined by dotted lines indicated by the reference number 14 delays each transition of the input clock signal by a finite interval.

The load capacitance 59 represents the intrinsic capacitance of a large number of field-effect transistors connected to the $\phi_1$ clock bus. In addition, the load capacitance 59 includes the intrinsic gate-to-ground capacitance of a FET 60 comprising part of a circuit contained within dotted lines designated by the reference number 18. This circuit within the dotted lines 18 corresponds to the second delay 18 of FIG. 1. The FET 60 includes a controlled or source electrode 61 connected to a reference or ground potential and a drain electrode 62 connected to a source electrode 63 of a load FET 65. The gate electrode of the load FET 65 and its other controlled electrode or drain 66 are both connected to a voltage $-V$ which tends at all times to turn ON the load FET 65. The drain 62 and the source 63 are connected to a load capacitance 69 which includes the gate-to-ground capacitance of the gate electrode of a FET 70. The FET 70 has a source electrode 71 and a drain 72. The drain 72 is connected to a source electrode 73 of another load FET 75. The load FET 75 has a gate electrode and a drain electrode 76 which are both connected to the same voltage $-V$. The circuit enclosed within the dotted lines 18 performs as a delay much like the circuit enclosed within the dotted lines 14.

The drain 72 is connected to a load capacitance 79 which is the intrinsic gate-to-ground capacitance of the FET 38 of the NAND-gate 12 and its surrounding capacitances.

For convenience of reference, the interconnection of the drain 72 of the FET 70 and the gate electrode of the FET 38 at the load capacitance 79 is referred to by the letter designation "B". The delayed signal at the point B in FIG. 3 is illustrated in the waveform B of FIG. 2. The waveform B is delayed somewhat from the waveform $\phi_1$ of FIG. 2 because of the delay caused by the load capacitance 69 of the delay 18 together with the ON resistances of the FETs 60 and 65 as well as the capacitance 79 and the ON resistances of the FETs 70 and 75.

The point B carries a delayed representation of the $\phi_1$ clock signal.

When the waveform B is at a substantial negative voltage, the FET 38 is ON and draws current through the load FET 35 to ground a load capacitance 89. The load capacitance 89 is the intrinsic capacitance of the $\phi_2$ clock bus. When the input clock signal at point A (waveform A, FIG. 2) is at a substantial negative voltage, the FET 30 is ON and grounds $\phi_2$ clock bus. Therefore, the $\phi_2$ clock bus is grounded except when both waveforms A and B are at a positive or ground potential, at which time the load FET 35 draws the $\phi_2$ clock bus voltage toward $-V$ less the threshold voltage of the FET 35.

Consequently, the $\phi_2$ clock experiences a negative pulse beginning a delay interval (of the delay 18) after the end or trailing edge of the negative pulse of the $\phi_1$ clock. The negative $\phi_2$ clock pulse ends at the beginning of the negative pulse of the input clock (A). The beginning of the negative $\phi_1$ clock pulse then starts a delay interval (of the delay 14) after the beginning of the negative pulse of the input clock. Therefore, the negative $\phi_1$ clock pulse does not begin until the delay interval (of the delay 14) after the end or trailing edge of the negative $\phi_2$ clock pulse.

It will be seen that both delays 14 and 18 have shortened the negative $\phi_2$ clock pulse, but the negative $\phi_1$ clock pulse is substantially the same duration as the negative input clock pulse. For most practical circuits this difference in duration will not be significant; but if significant, it can be corrected by adjusting the duty cycle of the input clock pulses.

If a longer delay is required in the delay 14, the circuit within the dotted lines 14 can simply be repeated in cascade with the drain 52 of the first delay circuit connected to the gate electrode of the FET 40 of the second delay circuit. The same is true of the delay 18.

Although only one specific embodiment of the invention is shown in the drawings, and described in the foregoing specification, it will be understood that invention is not limited to the specific embodiment described, but is capable of modification and rearrangement and substitution of parts and elements without departing from the spirit of the invention.

What is claimed is:

1. A circuit for generating a two-phase non-overlapping clock from a source of clock signals including:
   a first static inverter having an input and an output, the input connected to the source of clock signals;
   a first RC delay circuit at the output of the first static inverter;
   a second static inverter having an input and an output, the input connected to the delay circuit and the output comprising the first phase of the two-phase non-overlapping clock;
   a third static inverter having an input and an output the input connected to the output of the second static inverter;
   a second delay circuit connected to the output of the third static inverter;
   a fourth static inverter having an input and an output, the input connected to the second delay circuit; and
   a gate circuit having a first input and a second input and having an output, the first input connected to the output of the fourth static inverter, the second input connected to the source of clock signals, and the output comprising the second phase of the non-overlapping clock.

2. A clock generator according to claim 1 wherein the static inverters comprise field-effect transistor amplifiers and wherein the gate circuit comprises at least first and second field-effect transistors each having a gate and two controlled electrodes, the controlled electrodes of the first field-effect transistor connected to the controlled electrodes of the second field-effect transistor with the gates of the two field-effect transistors comprising the inputs to the gate circuit.

3. A circuit for generating from an input source of single phase clock signals having leading edges and trailing edges, two-phase, non-overlapping clock signals having leading edges and trailing edges comprising:
   a first delay for delaying both leading edges and trailing edges and having an input connected to the input source of clock signals and an output comprising the first phase non-overlapping clock signal whereby the leading edge of the first phase signal is delayed from the leading edge of the input source clock signal by an amount equal to the delay of the trailing edge of the first phase signal from the trailing edge of the input source clock signal;
   a second delay having an input and an output, the input connected to the first phase non-overlapping clock signal;
   a NAND-gate having two inputs and an output, the first input connected to the output of the second delay and the second input connected to the source of clock signals, the output of the NAND-gate comprising the second phase non-overlapping clock signal.

4. A clock generator circuit for generating from a source of single-phase clock signals, a two-phase, non-overlapping clock signal comprising:
   a first delay comprising two inverter circuits with an intermediate resistive-capacitive integrating circuit and having an input connected to the source of clock signals and an output comprising the first phase of the two-phase non-overlapping clock signal;
   a second delay comprising two inverter circuits with an intermediate resistive-capacitive integrating circuit and having an input and an output, the input connected to the first phase non-overlapping clock signal; and
   a NAND-gate having to inputs and an output, the first input connected to the output of the second delay and the second input connected to the source of clock signals, the output of the NAND-gate comprising the second phase non-overlapping clock signal.

5. In an MOS integrated circuit having a first voltage, a reference voltage, and a source of single-phase clock signals, a circuit for generating a first phase non-overlapping clock signal and a second phase non-overlapping clock signal comprising:
   a first field-effect transistor (40) having a control electrode and two controlled electrodes, the control electrode connected to the source of single-phase clock signals and one of the controlled electrodes connected to the reference voltage, the second controlled electrode connected through a load (45) to the first voltage;
   a second field-effect transistor 50 having a control electrode with intrinsic capacitance and first and second controlled electrodes, the control electrode with its intrinsic capacitance connected to the second controlled electrode of the first field-effect transistor, the first controlled electrode of the second field-effect transistor connected to the reference voltage, and the second controlled electrode connected through a load to the first voltage;
   an output load (59) connected to the second controlled electrode of the second field-effect transistor and carrying the first phase non-overlapping clock signal;
   a third field-effect transistor (60) having a control electrode and first and second controlled electrodes, the control electrode connected to the output load, the first controlled electrode connected to the reference voltage, and the second controlled electrode connected through a load (65) to the first voltage;
   a fourth field-effect transistor (70) having a control electrode with intrinsic capacitance and first and second controlled electrodes, the control electrode with its intrinsic capacitance connected to the second controlled electrode of the third field-effect transistor, the first controlled electrode connected to the reference voltage and the second controlled electrode connected through a load to the first voltage;
   a fifth field-effect transistor (38) having a control electrode and first and second controlled electrodes, the control electrode connected to the second controlled electrode of the fourth field-effect transistor, the first controlled electrode connected to the reference voltage, and the second controlled electrode connected through a load (35) to the first voltage;
   a sixth field-effect transistor (30) having a control electrode and first and second controlled electrodes, the control electrode connected to the source of single-phase clock pulses, the first controlled electrode connected to the reference voltage, and the second controlled electrode connected to the second controlled electrode of the fifth field-effect transistor;
   a load (89) connected to the second controlled electrode of the fifth and sixth field-effect transistors and carrying the second-phase non-overlapping clock signal.

6. A method of generating two phase non-overlapping clock signals having leading edges and trailing edges from a single input clock generating leading edges when the input clock turns ON and trailing edges when the input clock turns OFF comprising:

delaying the leading edges and trailing edges of the input clock signals to provide the leading edges and trailing edges respectively of the first phase non-overlapping clock signal;

turning ON the second phase non-overlapping clock to form its leading edge at a predetermined time after the first phase non-overlapping clock signal has been turned OFF; and turning OFF the second phase non-overlapping clock to form its trailing edge when the input clock signal turns ON.

7. A method of generating non-overlapping clock signals having leading edges and trailing edges from a single clock input having leading edges and trailing edges comprising:

delaying the leading edges and the trailing edges of the clock input to form a leading edges and trailing edges of a first clock output;

further delaying the first clock output to form an intermediate signal;

gating the undelayed clock input with the intermediate signal to produce a gated output signal; and inverting the gated output signal to produce a second clock output.

8. A circuit for producing non-overlapping clock signals having leading edges and trailing edges from a single input clock signal having leading edges and trailing edges comprising:

a first delay for delaying both the leading edges and trailing edges and having an input connected to the input clock signal and having an output comprising a first one of the non-overlapping clock signals whereby the leading edge of the first phase signal is delayed from the leading edge of the input source clock signal by an amount equal to the delay of the trailing edge of the first phase signal from the trailing edge of the input source clock signal;

a second delay having an input connected to the output of the first delay and having an output; and a gate circuit having two inputs and an output, one input connected to the output of the second delay, the other input connected to the input clock signal, and the output comprising the second one of the non-overlapping clock signals.

9. A circuit for generating non-overlapping first and second clock signals in response to single phase input signals and comprising:

an input terminal connected to the source of said single phase input signals;

a first phase signal output terminal;

a second phase signal output terminal;

a first delay circuit connected between said input terminal and said first phase output terminal to provide first phase signals corresponding in duration to said input signals but displaced in time therefrom;

a gating circuit having a first input, a second input, and an output, the first input connected to the input terminal and the output connected to the second phase output terminal;

a second delay circuit connected between the first phase signal output terminal and the second input of the gating circuit to provide intermediate signals corresponding in duration to said first phase output signals but displaced in time therefrom;

said gating circuit providing second phase signals in the joint absence of intermediate signals and single phase input signals.

10. A circuit for generating non-overlapping first and second clock signals in response to single phase input signals and comprising:

an input terminal for applying said input signals;

means connected to said input terminal for delaying said input signals to generate first phase signals equal to the input signals in duration but displaced in time therefrom;

means for delaying said first phase signal; and means jointly responsive to said input signals and said delayed first phase signals for generating second phase signals non-overlapping in time with said first phase signals.

* * * * *